(12) United States Patent
Dang et al.

(10) Patent No.: US 11,163,386 B2
(45) Date of Patent: Nov. 2, 2021

(54) TOUCH DISPLAY PANEL AND LIQUID CRYSTAL DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Kangpeng Dang, Beijing (CN); Cheng Zuo, Beijing (CN); Shuai Hou, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 448 days.

(21) Appl. No.: 16/096,560

(22) PCT Filed: Apr. 9, 2018

(86) PCT No.: PCT/CN2018/082231
§ 371 (c)(1),
(2) Date: Oct. 25, 2018

(87) PCT Pub. No.: WO2018/214653
PCT Pub. Date: Nov. 29, 2018

(65) Prior Publication Data
US 2021/0026467 A1    Jan. 28, 2021

(30) Foreign Application Priority Data

May 22, 2017  (CN) .......................... 201710363948.7

(51) Int. Cl.
*H05K 1/00* (2006.01)
*G06F 3/041* (2006.01)
(Continued)

(52) U.S. Cl.
CPC .......... *G06F 3/041* (2013.01); *G02F 1/13338* (2013.01); *H05K 1/028* (2013.01);
(Continued)

(58) Field of Classification Search
CPC .......... G06F 3/041; G06F 2203/04103; G02F 1/13338; G02F 1/13452; H05K 1/028; H05K 1/036; H05K 2201/0154
See application file for complete search history.

(56) References Cited

U.S. PATENT DOCUMENTS

2003/0215620 A1* 11/2003 Yoshida ................. C23C 18/285
428/209
2004/0036833 A1* 2/2004 Monzen ................. H05K 3/361
349/158
(Continued)

FOREIGN PATENT DOCUMENTS

CN      1310475 A      8/2001
CN      1717147 A      1/2006
(Continued)

OTHER PUBLICATIONS

International Search Report and Written Opinion for International Appl. No. PCT/CN2018/082231, dated Jun. 22, 2018.

*Primary Examiner* — Yuriy Semenenko
(74) *Attorney, Agent, or Firm* — Dinsmore & Shohl LLP

(57) ABSTRACT

A touch display panel and a liquid crystal display device are disclosed. The touch display panel comprises: a substrate (1); a Chip-On-Film (COF) (2), one end of the COF (2) being bound on the substrate and the other end of the COF (2) having a first binding pin (21); and a flexible circuit board (3), one end of the flexible circuit board (3) being bound on the substrate (1) and the other end of the flexible circuit board (3) having a second binding pin (31), wherein
(Continued)

a width L2 of the second binding pin (31) is greater than a width L1 of the first binding pin (21).

17 Claims, 2 Drawing Sheets

(51) Int. Cl.
G02F 1/1333 (2006.01)
H05K 1/02 (2006.01)
H05K 1/03 (2006.01)

(52) U.S. Cl.
CPC ... *H05K 1/036* (2013.01); *G06F 2203/04103* (2013.01); *H05K 2201/0154* (2013.01)

(56) References Cited

U.S. PATENT DOCUMENTS

| | | | | |
|---|---|---|---|---|
| 2007/0169886 A1* | 7/2007 | Watanabe | ............ | H05K 1/036 156/325 |
| 2008/0218057 A1* | 9/2008 | Chen | ............ | H01J 29/92 313/498 |
| 2010/0046185 A1* | 2/2010 | Hirasawa | ............ | H05K 1/111 361/767 |
| 2014/0190727 A1* | 7/2014 | Lee | ............ | H05K 1/0204 174/252 |
| 2016/0162083 A1* | 6/2016 | Zhang | ............ | G06F 3/04164 345/173 |
| 2017/0108732 A1 | 4/2017 | Oh | | |
| 2017/0185187 A1* | 6/2017 | Nakayama | ............ | G06F 3/0445 |
| 2018/0368249 A1* | 12/2018 | Chin | ............ | H05K 1/0263 |

FOREIGN PATENT DOCUMENTS

| | | |
|---|---|---|
| CN | 104375711 A | 2/2015 |
| CN | 104412315 A | 3/2015 |
| CN | 107203075 A | 9/2017 |
| JP | 2004-095872 A | 3/2004 |
| TW | 200425817 A | 11/2004 |

\* cited by examiner

«TOUCH DISPLAY PANEL AND LIQUID CRYSTAL DISPLAY DEVICE»

CROSS REFERENCE TO RELATED APPLICATIONS

This is a National Stage Application, filed under 35 U.S.C. 371 of International Patent Application No. PCT/CN2018/082231, filed Apr. 9, 2018, which claims priority to Chinese Patent Application No. 201710363948.7, filed May 22, 2017, the entire disclosure of each of which are incorporated herein by reference.

Technical Field

The present disclosure relates to a touch display panel and a liquid crystal display device.

BACKGROUND

During manufacturing of a touch display panel, in order to reduce the time for binding and improve the production efficiency, a Chip-On-Film (COF) and a flexible circuit board are generally pressed on a circuit board simultaneously by the same cutting head (i.e., they are simultaneously bound), such that a first binding pin of the COF is adhered to a first binding region of the circuit board by a first conductive connection layer and a second binding pin of the flexible circuit board is adhered to a second binding region on the circuit board by a second conductive connection layer.

SUMMARY

The present disclosure provides a touch display panel, comprising: a substrate; a Chip-On-Film (COF), one end of the COF being bound onto the substrate, and the other end of the COF having one or more first binding pins; and a flexible circuit board, one end of the flexible circuit board being bound onto the substrate, and the other end of the flexible circuit board having one or more second binding pins, wherein a width L2 of each of the one or more second binding pins is greater than a width L1 of each of the one or more first binding pins.

Optionally, a thickness of each of the one or more second binding pins is the same as a thickness of each of the one or more first binding pins.

Optionally, the flexible circuit board is manufactured by a process different from a process for manufacturing the COF.

Optionally, the flexible circuit board is manufactured by evaporating a copper onto a polyimide substrate using evaporation technology.

Optionally, the COF is manufactured by adhering a copper onto a polyimide substrate using an adhesive.

Optionally, L2-L1 is from 0.03 to 0.07 mm.

Optionally, L1 is from 0.7 to 0.9 mm, and L2 is from 0.75 to 0.95 mm.

The present disclosure further provides a liquid crystal display device, comprising: a touch display panel as described in any of the above embodiments; a circuit board having a first binding region and a second binding region; a first conductive connection layer connecting the one or more first binding pins onto the first binding region; and a second conductive connection layer connecting the one or more second binding pins onto the second binding region.

Optionally, the one or more first binding pins and the one or more second binding pins are bound onto the substrate simultaneously, and wherein a time for the binding is from 5 to 9 s.

Optionally, a cohesive force of the first conductive connection layer and a cohesive force of the second conductive connection layer after the binding are not less than 1000 N.

Optionally, the first conductive connection layer and the second conductive connection layer are made of a conductive adhesive.

Other characteristics and advantages of the present disclosure will be described subsequently in the description, and will partially become obvious in the description, or be understood by implementing the present disclosure. The object and other advantages of the present disclosure may be realized and obtained by means of the structures indicated specifically in the drafted description, claims, and appending drawings.

DESCRIPTIONS OF DRAWINGS

The drawings are used to provide further understandings on the technical solution of the present disclosure, and together with the examples of the present application, are used to illustrate the technical solution of the present disclosure, but shall not constitute limitations on the technical solution of the present disclosure.

DETAILED DESCRIPTION

In order to make the purpose, technical solution and advantages of the present disclosure clearer, examples of the present disclosure will be described in details below with reference to the drawings. It is to be noted that, without conflictions, the examples and the features in the examples of the present application can be combined randomly.

Many details are illustrated below to facilitate sufficient understandings on the present disclosure, but the present disclosure may also be implemented by manners different than those as mentioned here, so the scope of protection sought for in the present disclosure is not limited to the following examples.

In order to bind the COF and the flexible circuit board at the same time, it is desired that the COF and the flexible circuit board have the same manufacturing process, thickness and width (conventional flexible circuit board and COF have different manufacturing processes, and when they are bound according to the current mass production specifications, since the COF has a high thermal conductivity, at the time of binding, the conductive adhesive of the first conductive connection layer can be sufficiently dissolved after it absorbs heat, and the cohesive force of the first conductive connection layer can meet the requirement of design, but under this process condition, the flexible circuit board has a poor thermal conductivity, and at the time of binding, the conductive adhesive of the second conductive connection layer cannot be sufficiently dissolved due to insufficient amount of heat absorption, such that the cohesive force of the second conductive connection layer cannot meet the requirement of design; if the binding process is adjusted according to the design requirement with an avulsion force≥1000N corresponding to the flexible circuit board, the COF would be damaged due to an excessive amount of heat absorption; thus, it is desired that the COF and the flexible circuit board have the same manufacturing process, thickness and width). Thus, at the time of binding, the COF and the flexible circuit board have the same thermal conductivity and can be securely adhered onto the circuit board.

The manufacturing process of the COF cannot be changed, and thus the flexible circuit board has to be manufactured by a process identical with the manufacturing process of the COF. Since the manufacturing process of the COF has a high cost, the cost for manufacturing the flexible circuit board greatly increases, which is contradictory to the design concept of the enterprise on product optimization.

The touch display panel and the liquid crystal display device according to some embodiments of the present disclosure will be described below with reference to the drawings.

Figure 2:
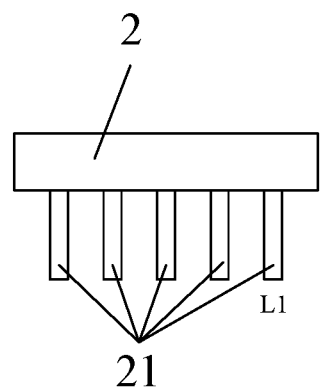
FIG. 2 is a schematic structural diagram showing the Chip-On-Film (COF) according to the present disclosure.
Figure 3:
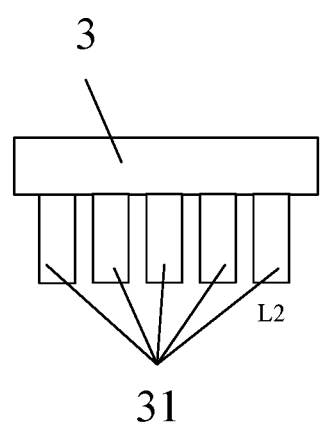
FIG. 3 is a schematic structural diagram showing the flexible circuit board according to the present disclosure.
Figure 4:
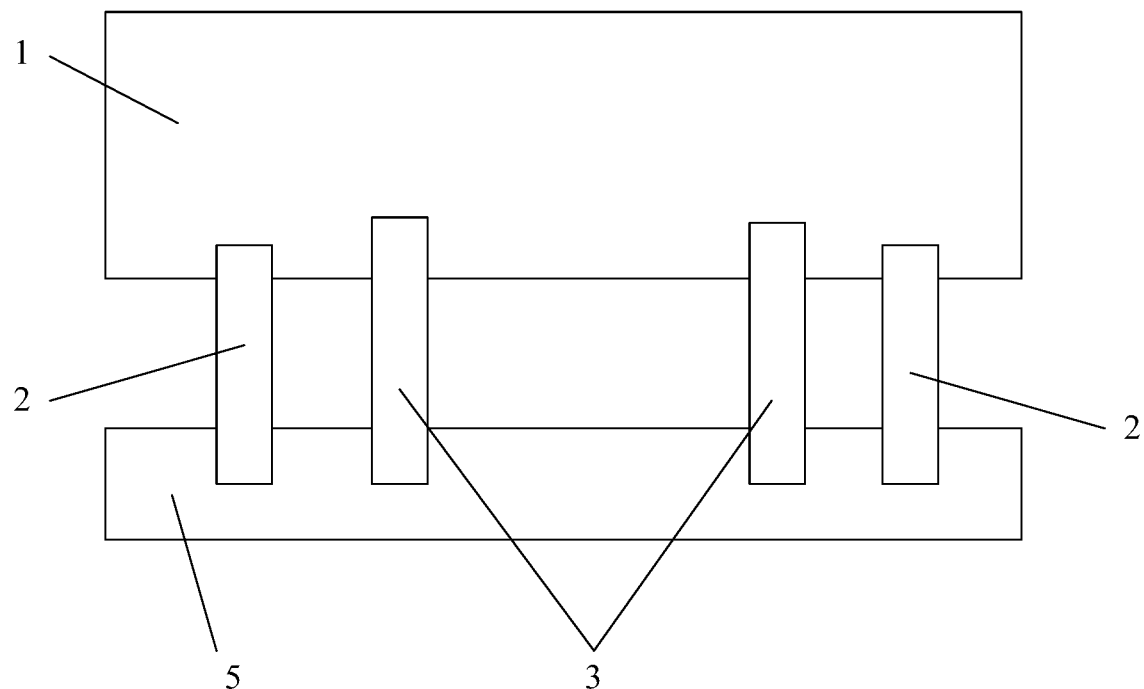
FIG. 4 is a schematic structural diagram showing the liquid crystal display device according to the embodiments of the present disclosure.

As shown in FIG. 4, the touch display panel provided according to the present disclosure comprises: a substrate 1; a COF 2 (as shown in FIG. 2), one end of the COF 2 being bound on the substrate 1 and the other end of the COF 2 having a first binding pin 21; and a flexible circuit board 3 (as shown in FIG. 3), one end of the flexible circuit board 3 being bound on the substrate 1 and the other end of the flexible circuit board having a second binding pin 31, wherein a with L2 of the second binding pin 31 is greater than a width L1 of the first binding pin 21.

When the touch display panel provided by the present disclosure employs a flexible circuit board 3 manufactured by a process different from the manufacturing process of the COF 2, the thermal conductivity of the second binding pin 31 is weaker than that of the first binding pin 21, and the width of the second binding pin 31 is increased to be greater than the width of the first binding pin 21, such that when they are bound onto the circuit board 5 simultaneously, during the same time period of the binding, the heat storage of the second binding pin 31 is increased and the binding state of the first binding pin 21 is maintained, so when the binding is finished, the excessive heat on the second binding pin 31 further dissolves the second conductive connection layer 42 to achieve an adhesive effect identical with that of the first conductive connection layer 41. The avulsion force of each of the first conductive connection layer 41 and the second conductive connection layer 42 after the binding is not less than 1000N as desired by the design.

Further, in order to perform the binding once at the same time, the thickness of the second binding pin 31 is the same as the thickness of the first binding pin 21, without mismatch therebetween so as to avoid the case that when there is a mismatch, only one of the two pins sufficiently contacts the cutting head while the other does not sufficiently contacts the cutting head and thus cannot be compacted by the cutting head, thereby ensuring the cohesive force of each of the first conductive connection layer 41 and the second conductive connection layer 42 after the binding is not less than 1000N, i.e., ensuring the avulsion force is ≥1000N.

Preferably, the flexible circuit board 3 is manufactured by evaporating a copper onto a polyimide substrate using evaporation technology, and the flexible circuit board 3 thus manufactured has good compactness and high price. The COF is manufactured by adhering a copper onto the polyimide substrate using an adhesive, and the COF thus manufactured has poor compactness and low price, and cannot be thinned, otherwise a poor process would be caused.

Particularly, L2-L1 is from 0.03 to 0.07 mm. For example, L1 is from 0.7 to 0.9 mm, and L2 is from 0.75 to 0.95 mm. After the first binding pin and the second binding pin with said data are simultaneously bound, the cohesive force of each of the first conductive connection layer 41 and the second conductive connection layer 42 is not less than 1000N, meeting the requirement of design and better ensuring quality of the product.

Figure 1:
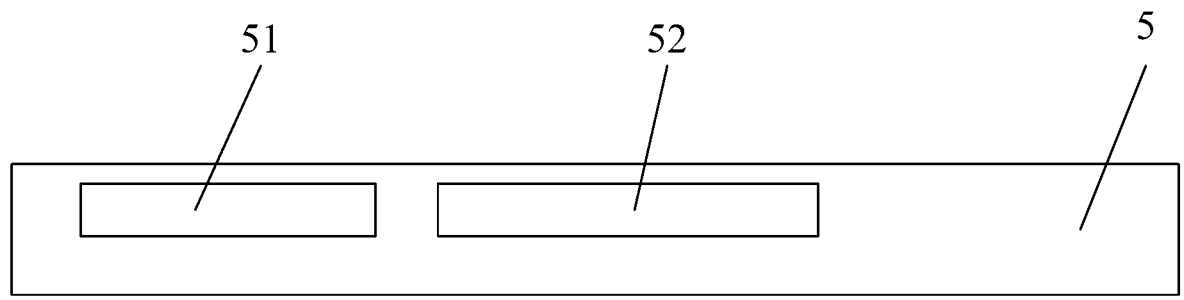
FIG. 1 is a schematic structural diagram showing the circuit board according to the present disclosure.
Figure 5:
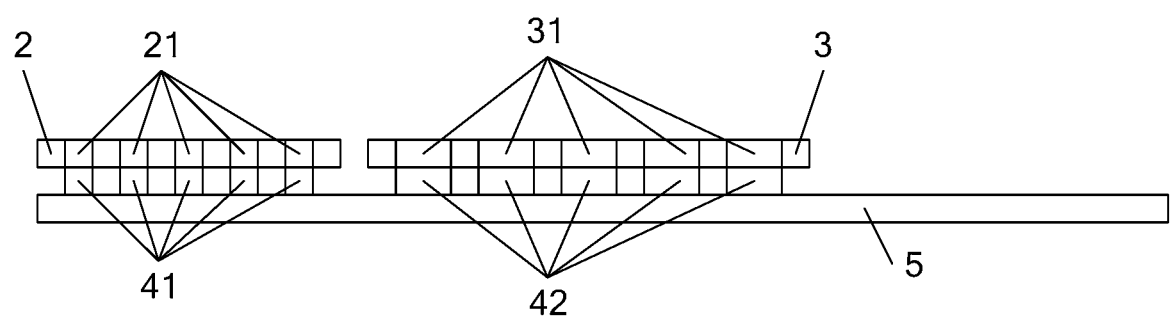
FIG. 5 is a schematic structural diagram showing the circuit board, the COF and the flexible circuit board after the binding as illustrated in FIG. 4.

The liquid crystal display device provided by the present disclosure, as shown in FIG. 4, comprises: a touch display panel according to any of the above embodiments; a circuit board 5 having a first binding region 51 and a second binding region 52 (as shown in FIG. 1); a first conductive connection layer 41 connecting the first binding pin 21 onto the first binding region 51; and a second conductive connection layer 42 connecting the second binding pin 31 onto the second binding region 52 (as shown in FIG. 5). After the binding, the cohesive force of each of the first conductive connection layer 41 and the second conductive connection layer 42 is not less than 1000 N as desired by the design. Thus, the flexible circuit board 3 manufactured by a process different from the manufacturing process of the COF 2 can be bound simultaneously with the COF 2, thereby effectively reducing the cost for buying the flexible circuit board 3.

The first binding pin 21 and the second binding pin 31 have the same thickness (as shown in FIG. 5), and the first binding pin 21 and the second binding pin 31 are simultaneously bound onto the substrate 1 to simplify the process steps. The time of the binding is preferably from 5 to 9 s, such as 5 s, 6 s, 7 s, 8 s or 9 s, each of which can achieve the object of the present application, and the spirits thereof do not depart from the design concept of the present disclosure, which would not be repeated here and shall all belong to the scope of protection sought for in the present application. After the binding, each of the cohesive force of the first conductive connection layer 41 and the cohesive force of the second conductive connection layer 42 is not less than 1000 N, meeting the requirement of design. Experimental data are given in the following table:

|    | Width | 1#   | 2#   | 3#   | 4#   | 5#   | 6#   | 7#   | 8#   | 9#   | Average Avulsion Force (N) | Time |
|----|-------|------|------|------|------|------|------|------|------|------|----------------------------|------|
| L1 | 0.7   | 1043 | 1030 | 1031 | 1023 | 1015 | 998  | 1047 | 1053 | 1032 | 1030                       | 7 s  |
| L2 | 0.75  | 1083 | 1075 | 1073 | 1082 | 1079 | 1089 | 1084 | 1090 | 1093 | 1083                       | 7 s  |
| L1 | 0.8   | 1105 | 1097 | 1106 | 1098 | 1113 | 1104 | 1097 | 1103 | 1104 | 1103                       | 7 s  |
| L2 | 0.85  | 1116 | 1152 | 1156 | 1162 | 1160 | 1159 | 1164 | 1158 | 1109 | 1148                       | 7 s  |

-continued

|    | Width | 1# | 2# | 3# | 4# | 5# | 6# | 7# | 8# | 9# | Average Avulsion Force (N) | Time |
|----|-------|------|------|------|------|------|------|------|------|------|------|-----|
| L1 | 0.9   | 1168 | 1194 | 1197 | 1187 | 1164 | 1154 | 1155 | 1168 | 1179 | 1174 | 7 s |
| L2 | 0.95  | 1164 | 1185 | 1199 | 1200 | 1159 | 1157 | 1166 | 1181 | 1164 | 1175 | 7 s |

Preferably, the first conductive connection layer 41 and the second conductive connection layer 42 are made of a conductive adhesive or the same material; the first conductive connection layer 41 connects the first binding pin 21 with the first binding region 51, and the second conductive connection layer 42 connects the second binding pin 31 to the second binding region 52.

In summary, when the touch display panel provided by the present disclosure employs a flexible circuit board manufactured by a process different from the manufacturing process of the COF, the thermal conductivity of the second binding pin is weaker than that of the first binding pin, and the width of the second binding pin is increased to be greater than the width of the first binding pin, such that when they are simultaneously bound on the circuit board, during the same time period of the binding, the heat storage of the second binding pin is increased and the binding state of the first binding pin is maintained, so when the binding is finished, the excessive heat on the second binding pin further dissolves the second conductive connection layer to achieve an adhesive effect identical with that of the first conductive connection layer. After the binding, the avulsion force of each of the first conductive connection layer and the second conductive connection layer is not less than 1000N as desired by the design.

As used herein, the terms "mounting", "interconnection", "connection", "fixing" and the like shall be understood in a broad sense. For example, the term "connection" may be a secure connection or a detachable connection, or an integral connection; alternatively, it may be a direct interconnection or an indirect interconnection via an intermediate. Those ordinary technicians in the art may learn the specific meanings of said terms according to the practical condition.

As used in the description, the terms "one example", "some examples", "embodiments" and the like refer to specific features, structures, materials or characteristics of the example or demonstration are contained in the at least one example or demonstration of the present disclosure. In the description, demonstrative expressions of said terms may not refer to the same example or demonstration. Moreover, the specific features, structures, materials or characteristics as described may be combined in a suitable manner in any one or more examples or demonstrations.

Although the embodiments revealed by the present disclosure are as mentioned above, the contents are only embodiments to facilitate understandings on the present disclosure but shall not limit the present disclosure. Those skilled in the art may make any amendment and modification in terms of the form and detail of the implementation of the present disclosure without departing from spirits and scope revealed by the present disclosure, but the scope of patent protection sought for in the present disclosure shall be defined by the appended claims.

What is claimed is:

1. A touch display panel, comprising:
   a substrate;
   a Chip-On-Film (COF), one end of the COF being bound on the substrate, and the other end of the COF having one or more first binding pins; and
   a flexible circuit board, one end of the flexible circuit board being bound on the substrate, and the other end of the flexible circuit board having one or more second binding pins, wherein a width L2 of each of the one or more second binding pins is greater than a width L1 of each of the one or more first binding pins, and wherein the one or more first binding pins and the one or more second binding pins are to be connected onto a circuit board.

2. The touch display panel according to claim 1, wherein a thickness of each of the one or more second binding pins is the same as a thickness of each of the one or more first binding pins.

3. The touch display panel according to claim 1, wherein the flexible circuit board is manufactured by a process different from a process for manufacturing the COF.

4. The touch display panel according to claim 3, wherein the flexible circuit board is manufactured by evaporating a copper onto a polyimide substrate using evaporation technology.

5. The touch display panel according to claim 3, wherein the COF is manufactured by adhering a copper onto a polyimide substrate using an adhesive.

6. The touch display panel according to claim 1, wherein L2-L1 is from 0.03 to 0.07 mm.

7. The touch display panel according to claim 1, wherein L1 is from 0.7 to 0.9 mm, and L2 is from 0.75 to 0.95 mm.

8. A liquid crystal display device, comprising:
   a touch display panel comprising:
      a substrate;
      a Chip-On-Film (COF), one end of the COF being bound on the substrate, and the other end of the COF having one or more first binding pins; and
      a flexible circuit board, one end of the flexible circuit board being bound on the substrate, and the other end of the flexible circuit board having one or more second binding pins, wherein a width L2 of each of the one or more second binding pins is greater than a width L1 of each of the one or more first binding pins;
   a circuit board having a first binding region and a second binding region;
   a first conductive connection layer connecting the one or more first binding pins onto the first binding region; and
   a second conductive connection layer connecting the one or more second binding pins onto the second binding region.

9. The liquid crystal display device according to claim 8, wherein the one or more first binding pins and the one or more second binding pins are bound onto the substrate simultaneously, and wherein a time for the binding is from 5 to 9s.

10. The liquid crystal display device according to claim 8, wherein, a cohesive force of the first conductive connection layer or a cohesive force of the second conductive connection layer after the binding is not less than 1000 N/m.

11. The liquid crystal display device according to claim 8, wherein the first conductive connection layer and the second conductive connection layer are made of a conductive adhesive.

12. The liquid crystal display device according to claim 8, wherein a thickness of each of the one or more second binding pins is the same as a thickness of each of the one or more first binding pins.

13. The liquid crystal display device according to claim 8, wherein the flexible circuit board is manufactured by a process different from a process for manufacturing the COF.

14. The liquid crystal display device according to claim 13, wherein the flexible circuit board is manufactured by evaporating a copper onto a polyimide substrate using evaporation technology.

15. The liquid crystal display device according to claim 13, wherein the COF is manufactured by adhering a copper onto a polyimide substrate using an adhesive.

16. The liquid crystal display device according to claim 8, wherein L2-L1 is from 0.03 to 0.07 mm.

17. The liquid crystal display device according to claim 8, wherein L1 is from 0.7 to 0.9 mm, and L2 is from 0.75 to 0.95 mm.

* * * * *